United States Patent [19]
Mitchell et al.

[11] Patent Number: 5,773,359
[45] Date of Patent: Jun. 30, 1998

[54] INTERCONNECT SYSTEM AND METHOD OF FABRICATION

[75] Inventors: Douglas G. Mitchell, Tempe; Francis J. Carney, Gilbert; Eric J. Woolsey, Chandler, all of Ariz.

[73] Assignee: Motorola, Inc., Schaumburg, Ill.

[21] Appl. No.: 578,255

[22] Filed: Dec. 26, 1995

[51] Int. Cl.$^6$ .................................................. H01L 21/441
[52] U.S. Cl. ........................................ 438/614; 156/656.1
[58] Field of Search .................................. 437/190, 183, 437/192; 156/656.1

[56] References Cited

U.S. PATENT DOCUMENTS

| | | | |
|---|---|---|---|
| 5,298,459 | 3/1994 | Arikawa et al. | 437/183 |
| 5,310,699 | 5/1994 | Chikawa et al. | 437/183 |
| 5,447,599 | 9/1995 | Li et al. | 216/17 |
| 5,470,787 | 11/1995 | Greer . | |
| 5,587,336 | 12/1996 | Wang et al. | 437/183 |

FOREIGN PATENT DOCUMENTS

| | | |
|---|---|---|
| 57-154858 | 9/1982 | Japan . |
| 61-251153 | 11/1986 | Japan . |
| 2-253628 | 10/1990 | Japan . |
| 4-133330 | 5/1992 | Japan . |
| 5-013421 | 8/1993 | Japan . |

*Primary Examiner*—John Niebling
*Assistant Examiner*—C. Everhart
*Attorney, Agent, or Firm*—George C. Chen

[57] ABSTRACT

An interconnect system (31) includes an interconnect bump (29) over an under bump metallurgy (25). The under bump metallurgy (25) includes a barrier layer (26) having a barrier material such as titanium, an adhesion layer (28) having an adhesion material such as copper, and a mixture layer (27) having both the barrier material and the adhesion material. The mixture layer (27) is located between the barrier layer (26) and the adhesion layer (28), and the adhesion layer (28) is located between the mixture layer (27) and the interconnect bump (29). The interconnect bump (29) contains solder and is used as an etch mask when patterning the under bump metallurgy (25).

11 Claims, 1 Drawing Sheet

INTERCONNECT SYSTEM AND METHOD OF FABRICATION

BACKGROUND OF THE INVENTION

This invention relates, in general, to semiconductor components, and more particularly, to interconnect systems for semiconductor components.

Semiconductor chips often use interconnect bumps for electrical coupling to another semiconductor chip or to a different semiconductor component. The use of interconnect bumps requires the use of an under bump metallurgy (UBM) to support the interconnect bump, to provide a diffusion barrier, and to provide adequate adhesion between the interconnect bump and a supporting substrate. For copper or gold interconnect bumps, UBM systems of chrome/copper/gold, titanium/copper/gold, titanium tungsten/copper/gold, chrome/nickel/gold, titanium/nickel/gold, or the like are often used.

Another type of interconnect bump uses solder instead of copper or gold. The use of solder interconnect bumps provides a more cost effective interconnect system compared to those interconnect systems employing copper or gold interconnect bumps. However, solder interconnect bumps are often used with UBM systems that were developed for copper or gold interconnect bumps. Consequently, poor adhesion between the UBM and the solder interconnect bump produces poor reliability for interconnect systems that use solder interconnect bumps.

Accordingly, a need exists for an interconnect system, which utilizes an under bump metallurgy that provides adequate adhesion to a solder interconnect bump. The under bump metallurgy should be easy to fabricate and should be cost effective, and the method of fabricating the interconnect system should not significantly increase the cycle time of manufacturing a semiconductor component.

DETAILED DESCRIPTION OF THE DRAWINGS

Figure 1:
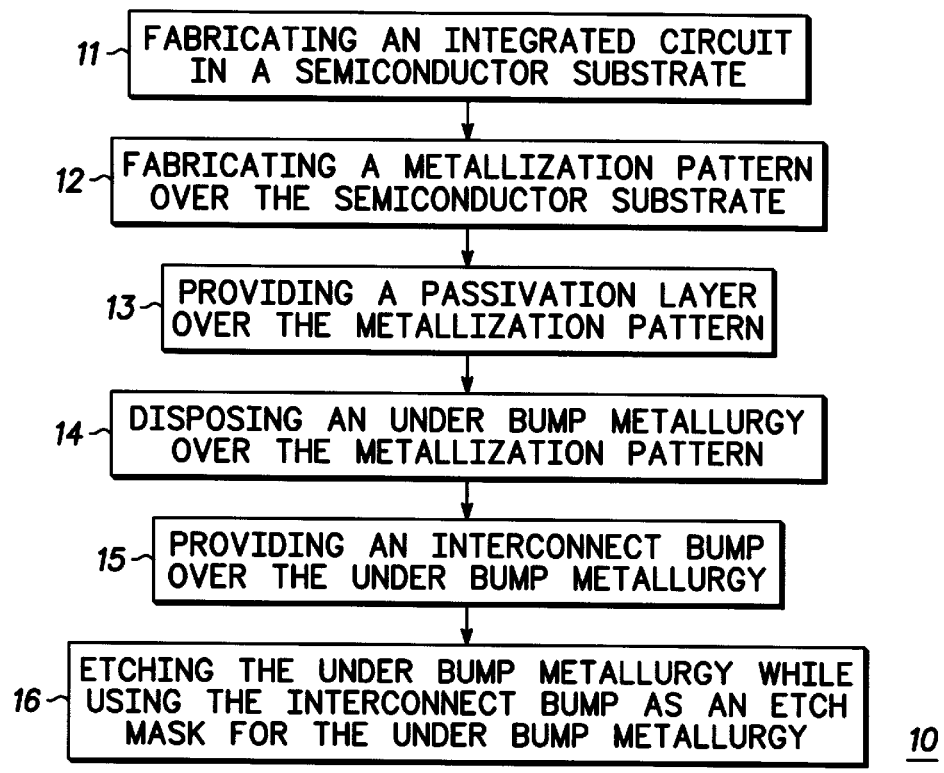
FIG. 1 outlines an embodiment of a method of fabricating an interconnect system in accordance with the present invention; an FIGS. 2 and 3 illustrate a cross-sectional view of an embodiment of an interconnect system during fabrication in accordance with the present invention.
Figure 2:
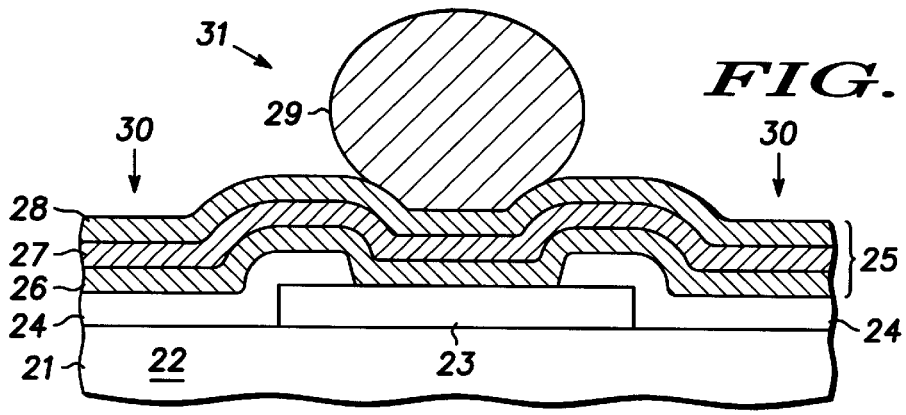

Turning to the figures for a more detailed description, FIG. 1 outlines an embodiment of a method of fabricating an interconnect system in accordance with the present invention. In FIG. 1, a process or method 10 begins with a step 11, which fabricates an integrated circuit in a semiconductor substrate. Conventional semiconductor processing techniques such as, for example, ion implantation, dry etching, and dielectric deposition are used in step 11 to fabricate or manufacture the integrated circuit in the semiconductor substrate The semiconductor substrate and integrated circuit of step 11 are illustrated in the subsequent figure. In particular, FIG. 2 illustrates a cross-sectional view of an embodiment of an interconnect system during fabrication in accordance with the present invention. A semiconductor component 20 of FIG. 2 includes a semiconductor substrate or substrate 21 of step 11. Substrate 21 preferably comprises a semiconductor such as, for example, silicon or gallium arsenide. An integrated circuit 22 in substrate 21 schematically represents the integrated circuit of step 11 and preferably comprises metal-oxide-semiconductor field effect transistors, bipolar transistors, or both. In an alternative embodiment, integrated circuit 22 is only comprised of a single transistor or a single semiconductor device including, but not limited to, a diode or a resistor.

A passivation layer 24 and an interconnect system 31 that includes or contains a metal layer 23, an under bump metallurgy 25, and an interconnect bump 29 in FIG. 2 will be described in detail below.

Referring back to FIG. 1, method 10 continues with a step 12, which fabricates a metallization pattern over the semiconductor substrate. FIG. 2 portrays electrically conductive layer or metal layer 23 over substrate 21. Metal layer 23 represents a portion of the metallization pattern of step 12. Metal layer 23 is electrically coupled to integrated circuit 22. Metal layer 23 preferably comprises aluminum but can also contain copper and silicon as known in the art. Metal layer 23 is formed or fabricated over substrate 21 using, for example, conventional sputtering, photolithographic, and etching processes. In a preferred embodiment, metal layer 23 is a metal pad having a diameter of approximately 75–100 microns and a thickness of approximately 1–3 microns.

Continuing with the next step of method 10 in FIG. 1, step 13 provides a passivation layer over the metallization pattern. As depicted in FIG. 2, passivation layer 24 is located over metal layer 23, integrated circuit 22, and substrate 21. Passivation layer 24 can be deposited over substrate 21 using, for example, a chemical vapor deposition technique. In a preferred embodiment, passivation layer 24 comprises silicon oxide, silicon nitride, or silicon oxynitride and is approximately 0.3–1.0 microns thick.

After passivation layer 24 is deposited over substrate 21, a portion of passivation layer 24 is removed using an etch process. Specifically, a portion of passivation layer 24 located over metal layer 23 is removed. A photolithographic etch mask (not shown) can be used to define the desired portion of passivation layer 24 to be removed by the etch process. The photolithographic etch mask is removed from passivation layer 24 after etching passivation layer 24.

Again, returning to FIG. 1, method 10 proceeds with disposing an under bump metallurgy over the metallization pattern in a step 14. In FIG. 2, the under bump metallurgy of step 14 is represented by under bump metallurgy or UBM 25. UBM 25 is located over substrate 21, integrated circuit 22, metal layer 23, and passivation layer 24.

In a preferred embodiment, UBM 25 comprises three layers: a barrier layer or layer 26, a mixture layer or layer 27, and an adhesion layer or layer 28. Preferably, all three layers of UBM 25 are metal. Layer 26 comprises a barrier material including, but not limited to, titanium tungsten, nickel, or chrome but preferably comprises titanium and is preferably approximately 1,000–1,500 angstroms (Å) thick. Layer 28 comprises an adhesion material including, but not limited to, copper and is preferably approximately 4,000–6,000 Å thick.

Layer 27, which is located between layers 26 and 28, contains the barrier material of layer 26 and the adhesion material of layer 28. For instance, in a preferred embodiment where layer 26 comprises titanium and where layer 28 comprises copper, layer 27 comprises titanium copper and is approximately 1,000–2,000Å thick. With layer 27 comprised of a mixture of the elements of layers 26 and 28, layer 27 serves as a transition layer between layers 26 and 28 to provide improved reliability for UBM 25 as described below.

While layers 26, 27, and 28 can be evaporated over substrate 21, layers 26, 27, and 28 are preferably sputtered over substrate 21. A sputtering technique is preferred because it is faster than an evaporation technique and because it provides better adhesion for the deposited layers.

As an example of a preferred sputtering process for forming UBM 25, a titanium sputtering target is used for sputtering layer 26, a copper sputtering target is used for sputtering layer 28, and a third sputtering target comprised of approximately 50 percent (%) titanium and 50% copper is used for sputtering layer 27. The Materials Research Corporation of Orangeburg, N.Y. manufactures a sputtering tool having a model number 643 that can hold three sputtering targets. In an alternative embodiment, both the titanium sputtering target and the copper sputtering target are used for sputtering layer 27. In other words, instead of using a single sputtering target, two separate sputtering targets can be used to deposit layer 27.

Returning to FIG. 1, method 10 continues with step 15, which provides an interconnect bump over the under bump metallurgy. In FIG. 2, interconnect bump 29 is located over UBM 25, metal layer 23, and substrate 21. Interconnect bump 29 is electrically coupled to integrated circuit 22 through UBM 25 and metal layer 23. In a preferred embodiment, interconnect bump is comprised of solder, which is electroplated over UBM 25. For example, a photolithographic pattern (not shown) is formed over UBM 25 and exposes a portion of UBM 25, and an electroplating process is used to form interconnect bump 29 over the exposed portion of UBM 25.

Preferably, interconnect bump 29 is a solder comprised of approximately 97%–5% lead and 3%–95% tin. In an alternative embodiment, the solder contains indium or bismuth in place of the lead. In a preferred embodiment, interconnect bump 29 is similar in shape to a sphere with a diameter of approximately 50–100 microns. Preferably, interconnect bump 29 has a smaller diameter than metal layer 23.

During the preferred electroplating process of step 15, UBM 25 and specifically layer 28 serves as a plating bus. During subsequent processing such as, for example, reflow during bump formation, die assembly, or rework, a portion of the copper in layer 28 is consumed by interconnect bump 29. In other words, at high temperatures over about 150–350 degrees Celsius (°C.), an intermetallic of tin and copper can be formed at the interface between layer 28 and interconnect bump 29.

Copper is preferably used in layers 27 and 28 because solder adheres to copper. Titanium is preferably used in layer 26 because titanium is a diffusion barrier for copper and solder. The titanium in layer 26 prevents contaminants such as, for example, the copper of layers 27 and 28 and the lead and tin of interconnect bump 29 from diffusing into metal layer 23. Titanium is also preferably used in layer 26 because titanium provides a low stress adhesion layer to the aluminum of metal layer 23.

While the titanium of layer 26 adheres to the aluminum of metal layer 23, the solder of interconnect bump 29 does not adhere to the titanium of layer 26. Therefore, layer 27 is located over layer 26 to provide a transition layer or region between the barrier material of layer 26 and interconnect bump 29. If the copper of layer 28 is completely consumed by the solder of interconnect bump 29, layer 27 also serves as a wettable adhesion film for the solder of interconnect bump 29. Interconnect bump 29 will not completely consume layer 27 because of the titanium in layer 27.

Figure 3:
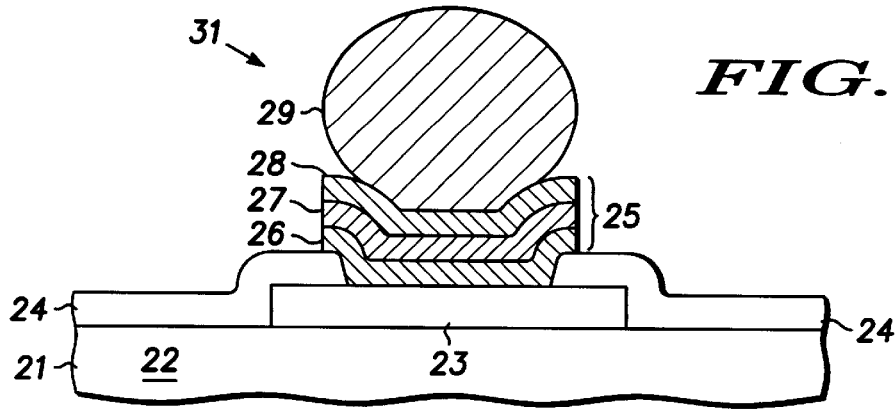

Back in FIG. 1, method 10 continues with step 16, which etches the under bump metallurgy while using the interconnect bump as an etch mask for the under bump metallurgy. FIG. 2 portrays semiconductor component 20 and interconnect system 31 prior to step 16, which removes or etches portion 30 of UBM 25. FIG. 3 portrays semiconductor component 20 and interconnect system 31 after the etch process of step 16.

In a preferred embodiment where interconnect bump 29 is comprised of lead and tin and where layer 28 is comprised of copper, an etchant that is commercially available under the name Metex™ from MacDermid, Incorporated of Waterbury, Conn. is used to wet etch layer 28 at room temperature for about 2–3 minutes. Interconnect bump 29 serves as an etch mask for layer 28 when the Metex™ etchant is used in step 16.

After layer 28 is etched, a different etchant is preferably used to remove layers 27 and 26. For example, in a preferred embodiment where layer 26 comprises titanium, where layer 27 comprises titanium and copper, and where interconnect bump 29 comprises tin and lead, a solution comprised of about 100–300 milliliters (ml) of 30% hydrogen peroxide ($H_2O_2$), about 100–300 ml of deionized water ($H_2O$), about 1–40 ml of ammonium hydroxide ($NH_4OH$), and about 1–50 grams of (ethylenedinitrilo) tetraacetic acid tetrasodium salt, dihydrate is used to etch layers 27 and 26 at about 15°–30°C. for approximately 2–5 minutes. Preferably, the pH level of the above etchant is between approximately 6–14. Preferably, the volumetric ratio between the 30% hydrogen peroxide and the deionized water is approximately 1:1. It is understood that the amount of 30% hydrogen peroxide in the wet etchant described above is limited by the fact that high concentrations of hydrogen peroxide can etch the lead in interconnect bump 29. Again, interconnect bump 29 serves as an etch mask for layers 27 and 26 when this second wet etchant is used in step 16 of method 10. Preferably, the second wet etchant also selectively etches layers 26 and 27 versus layer 28 and interconnect bump 29.

In an alternative embodiment, the (ethylenedinitrilo) tetraacetic acid tetrasodium salt, dihydrate in the above etchant can be replaced with (ethylenedinitrilo) tetraacetic acid disodium salt, dihydrate.

In a conventional process, an additional photolithographic or molybdenum etch mask is required for patterning the under bump metallurgy. However, in the present invention, interconnect bump 29 is not substantially etched by the etchants of step 16, and therefore, interconnect bump 29 is used as the etch mask for step 16. Thus, the cycle time, complexity, and cost of the present invention is reduced compared to the cycle time, complexity, and cost of the prior art because an extra masking step is not needed in the present invention.

While the invention has been particularly shown and described with reference to preferred embodiments, it will be understood by those skilled in the art that changes in form and detail may be made without departing from the spirit and scope of the invention. For instance, in an alternative embodiment, substrate 21 is comprised of a material other than a semiconductor. As an example, substrate 21 can be a polyester circuit board. As an additional example of an alternative embodiment of the present invention, an electroless plating process can be used in place of the electroplating process of step 15 in method 10. Yet another alternative embodiment uses a polyimide layer over passivation layer 24 or in place of passivation layer 24.

Therefore, in accordance with the present invention, it is apparent there has been provided an improved interconnect system that overcomes the disadvantages of the prior art.

The present invention eliminates problems associated with poor reliability due to a lack of adhesion between interconnect bumps and under bump metallurgy. The present invention also eliminates the need to plate a thick copper layer over the under bump metallurgy to ensure adhesion between the interconnect bump and the UBM. The present invention also reduces the cycle time, cost, and complexity of the process for manufacturing an interconnect system.

We claim:

1. A method of manufacturing an interconnect system, the method comprising the steps of:

providing a substrate;

disposing an electrically conductive layer over the substrate;

disposing a first layer over the electrically conductive layer, the first layer comprising a barrier material;

disposing a second layer over the first layer, the second layer comprising an adhesion material and the barrier material; and disposing a third layer over the second layer after the step of disposing the second layer, the third layer comprising the adhesion material.

2. The method according to claim 1, further comprising the step of providing a passivation layer over the substrate.

3. The method according to claim 1, further comprising the steps of:

providing an interconnect bump over the third layer, the interconnect bump coupled to the electrically conductive layer through the first, second, and third layers;

etching the first, second, and third layers; and using the interconnect bump as an etch mask during the etching step.

4. The method according to claim 3, further comprising the step of providing tin and lead for the interconnect bump.

5. The method according to claim 1, further comprising the steps of:

sputtering a first metal for the first layer; and sputtering a second metal for the third layer.

6. The method according to claim 5, further comprising the step of:

providing titanium for the first metal; and providing copper for the second metal.

7. A method of manufacturing a semiconductor component, the method comprising the steps of:

providing a semiconductor substrate;

fabricating an integrated circuit in the semiconductor substrate;

forming a metal layer over the semiconductor substrate, the metal layer coupled to the integrated circuit;

sputtering a barrier layer over the metal layer, the barrier layer having a barrier material;

sputtering a mixture layer over the barrier layer, the mixture layer having the barrier material and an adhesion material;

sputtering an adhesion layer over the mixture layer, the adhesion layer having the adhesion material;

forming an interconnect bump over the adhesion layer; and using the interconnect bump as an etch mask while etching the adhesion layer, the mixture layer, and the barrier layer.

8. The method according to claim 7, further comprising the steps of:

providing copper for the adhesion material; and providing titanium for the barrier layer.

9. The method according to claim 8, wherein the step of forming an interconnect bump includes plating solder over the adhesion layer and the metal layer.

10. The method according to claim 8, wherein the step of using the interconnect bump as an etch mask includes using a solution comprising hydrogen peroxide, ammonium hydroxide, and (ethylenedinitrilo) tetraacetic acid tetrasodium salt, dihydrate to etch the mixture layer and the barrier layer.

11. The method according to claim 8, wherein the step of using the interconnect bump as an etch mask includes using a solution comprising hydrogen peroxide, ammonium hydroxide, and (ethylenedinitrilo) tetraacetic acid disodium salt, dihydrate to etch the mixture layer and the barrier layer.

* * * * *